(12) United States Patent
Someya et al.

(10) Patent No.: US 11,322,194 B2
(45) Date of Patent: *May 3, 2022

(54) COMPENSATING OFFSETS IN BUFFERS AND RELATED SYSTEMS, METHODS, AND DEVICES

(71) Applicant: Micron Technology, Inc., Boise, ID (US)

(72) Inventors: Minoru Someya, Tokyo (JP); Yukihide Suzuki, Tokyo (JP); Sadayuki Okuma, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/147,976

(22) Filed: Jan. 13, 2021

(65) Prior Publication Data

US 2021/0134350 A1    May 6, 2021

Related U.S. Application Data

(63) Continuation of application No. 16/598,905, filed on Oct. 10, 2019, now Pat. No. 10,937,486.

(51) Int. Cl.
| | |
|---|---|
| *G11C 8/00* | (2006.01) |
| *G11C 11/408* | (2006.01) |
| *G11C 11/409* | (2006.01) |
| *G11C 7/10* | (2006.01) |
| *G11C 7/22* | (2006.01) |
| *G11C 11/4074* | (2006.01) |

(52) U.S. Cl.
CPC ........ *G11C 11/4082* (2013.01); *G11C 7/1018* (2013.01); *G11C 7/225* (2013.01); *G11C 11/409* (2013.01); *G11C 11/4074* (2013.01)

(58) Field of Classification Search
CPC .............. G11C 11/4082; G11C 11/409; G11C 11/4074; G11C 7/1018; G11C 7/225
See application file for complete search history.

(56) References Cited

U.S. PATENT DOCUMENTS

| | | |
|---|---|---|
| 9,792,964 B1 | 10/2017 | Sadayuki |
| 10,153,016 B2 | 12/2018 | Sadayuki |
| 10,211,832 B1 | 2/2019 | Matsuno et al. |
| 10,325,659 B1 | 6/2019 | Tang et al. |
| 10,937,486 B1* | 3/2021 | Someya ................ G11C 11/409 |
| 2002/0031041 A1* | 3/2002 | Kuge .................. G11C 11/4093 |
| | | 365/233.1 |

(Continued)

*Primary Examiner* — Toan K Le
(74) *Attorney, Agent, or Firm* — TraskBritt

(57) ABSTRACT

Compensating for offsets in buffers and related systems, methods, and devices are disclosed. An apparatus includes buffers, control circuitry, and fuses. Each of the buffers includes an output and an offset adjustment input. Each of the buffers is controllable to adjust a direct current offset of an output voltage potential responsive to an offset adjustment code provided to the offset adjustment input. The control circuitry includes sets of offset latches. The offset adjustment input of each of the buffers is operably coupled to a different one of the sets of offset latches. Each set of offset latches is configured to provide the offset adjustment code to the offset adjustment input of a corresponding buffer. The fuses are configured to provide the offset adjustment code to each of a subset of the sets of offset latches.

20 Claims, 10 Drawing Sheets

(56) References Cited

U.S. PATENT DOCUMENTS

| | | | |
|---|---|---|---|
| 2006/0226871 A1* | 10/2006 | Ito | G11C 7/1036 326/38 |
| 2009/0146722 A1* | 6/2009 | Chen | H03F 3/45183 327/307 |
| 2009/0302923 A1 | 12/2009 | Smeloy et al. | |
| 2010/0231300 A1 | 9/2010 | Dragos | |
| 2015/0222252 A1* | 8/2015 | Kim | H03K 5/003 327/307 |
| 2018/0082721 A1 | 3/2018 | Sadayuki | |

* cited by examiner

COMPENSATING OFFSETS IN BUFFERS AND RELATED SYSTEMS, METHODS, AND DEVICES

CROSS-REFERENCE TO RELATED APPLICATION

This application is a continuation of U.S. patent application Ser. No. 16/598,905, filed Oct. 10, 2019, now U.S. Pat. No. 10,937,486, issued Mar. 2, 2021, the disclosure of which is hereby incorporated herein in its entirety by this reference.

FIELD

The present disclosure relates, generally, to compensation of offsets in buffers, and more specifically to compensation of offsets in input buffers of memory devices.

BACKGROUND

Memory chips, such as dynamic random-access memory (DRAM) chips, sometimes include data input/output (DQ) pins configured to receive and transmit data input/output (I/O) signals from and to other electronic devices (e.g., control circuitry operably coupled to the DQ pins). Input buffers at the DQ pins buffer data I/O signals received at the DQ pins.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
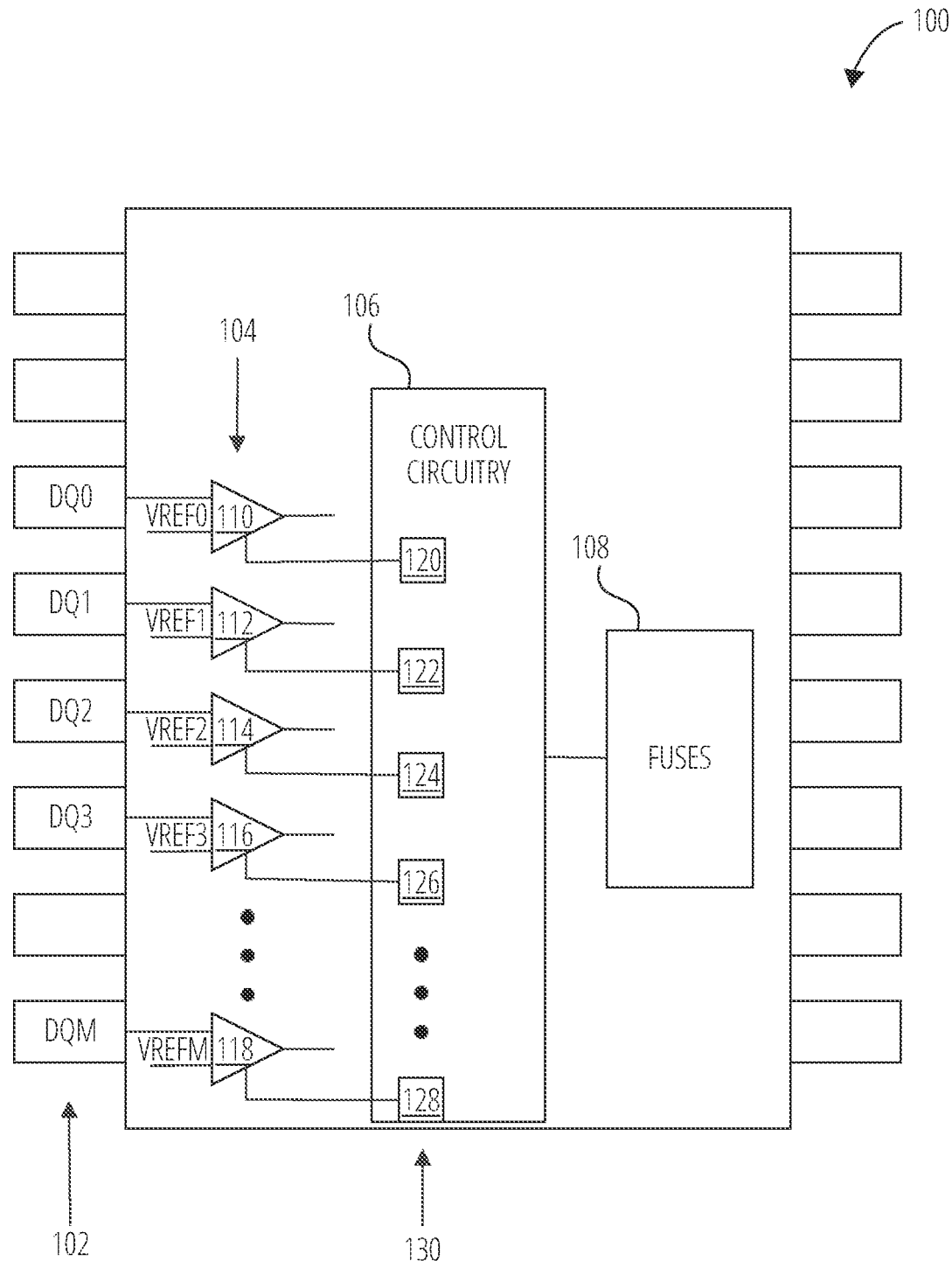
FIG. 1 is a mixed schematic diagram of a memory device according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Input buffers (e.g., input buffers used for data input/output in memory chips) may have direct current voltage offsets at their outputs as compared to their inputs. Due to the increased speed and reduced voltages of modern electronics, compensation for input buffer offsets has become important. In input buffers having controllable offsets, the offsets may be compensated for. For example, these input buffers may include offset adjustment inputs configured to accept offset adjustment codes indicating offset adjustments that compensate for built-in offsets of the input buffers. Offset adjustment codes indicating mounts of offset voltage adjustments to compensate for the offsets may be provided to the offset adjustment inputs. The offset adjustment codes may be stored (e.g., using fuses or the some other data storage medium) and provided to the offset adjustment inputs to compensate for the offsets.

FIG. 1 is a mixed schematic diagram of a memory device 100, according to some embodiments. The memory device 100 includes data inputs 102 (e.g., DQ0, DQ1, DQ2, DQ3, . . . , DQM) operably coupled to input buffers 104 (e.g., input buffer 110, input buffer 112, input buffer 114, input buffer 116, input buffer 118). The input buffers 104, which may be differential type buffers, are configured to buffer data signals provided to the data inputs 102. Each one of the input buffers 104 includes a reference voltage input (VREF0 for input buffer 110, VREF1 for input buffer 112, VREF2 for input buffer 114, VREF3 for input buffer 116, VREFM for input buffer 118). The input buffers 104 may use the reference voltage inputs to compare input data signals to determine logic levels of the input data signals.

The memory device 100 also includes control circuitry 106 operably coupled to the input buffers 104. The control circuitry 106 is configured to control offsets of the input buffers 104. The control circuitry 106 includes sets of offset latches 130 (e.g., set of offset latches 120, set of offset latches 122, set of offset latches 124, set of offset latches 126, set of offset latches 128) coupled to offset adjustment inputs of the input buffers 104. Each one of the sets of offset latches 130 is configured to provide an offset adjustment code to one of the input buffers 104 to compensate for offsets of the input buffers 104.

The memory device 100 further includes fuses 108 operably coupled to the control circuitry 106. The fuses 108 are configured to store at least a portion of the input offset codes to enable the control circuitry 106 to set the input offset codes to the sets of offset latches 130.

In operation the control circuitry 106 uses the input offset codes stored in the fuses 108 to set the input offset codes to the sets of offset latches 130. Accordingly, the sets of offset latches 130 provide the input offset codes to the input buffers 104, compensating for the offsets of the input buffers 104. With the input buffers 104 properly compensated, the input buffers 104 may function to buffer data signals received from the data inputs 102.

In some embodiments the offset adjustment codes may include multiple bit codes. By way of non-limiting example, the offset adjustment codes may be two-bit codes, providing four total different offset adjustment code values. In some embodiments one of the offset adjustment codes may correspond to zero offset adjustment. In some embodiments one or more of the offset adjustment codes may correspond to a positive amount of offset adjustment. In some embodiments one or more of the offset adjustment codes may correspond to a negative amount of offset adjustment. Since in some embodiments the offset adjustment codes may include multiple bits, each set of the sets of offset latches 130 may include a sufficient number of latches to accommodate the number of bits in each offset adjustment code. For example, in embodiments where the offset adjustment codes are two-bit offset adjustment codes, at least two latches may be included in each set of the sets of offset latches 130 to accommodate the two-bit offset adjustment codes. As another example, in embodiments where the offset adjustment codes are four-bit offset adjustment codes, at least four latches may be included in each set of the sets of offset latches 130 to accommodate the four-bit offset adjustment codes.

Figure 2:
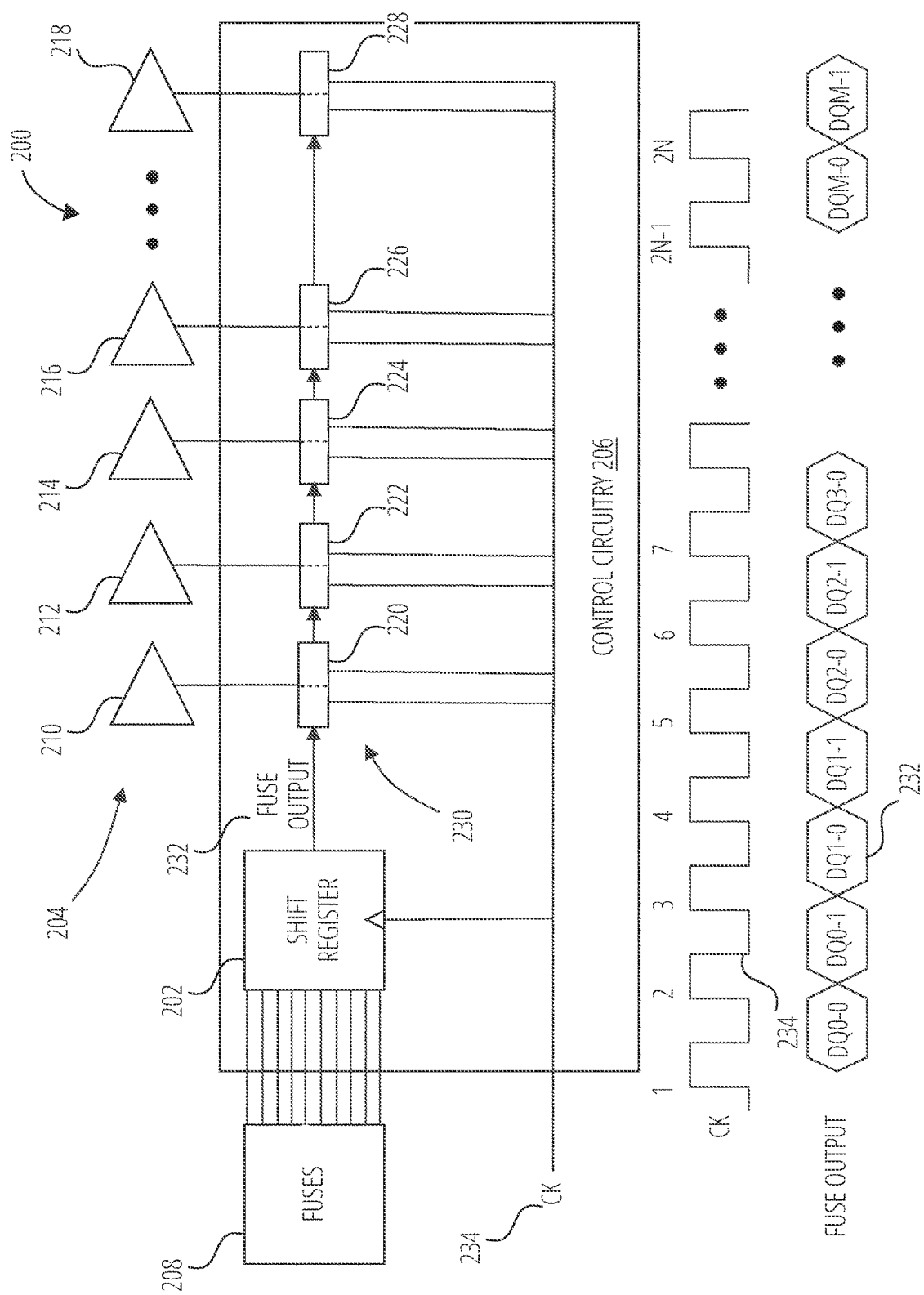
FIG. 2 is a circuit schematic illustration of a memory device, which is an example of the memory device of FIG. 1, according to some embodiments.

A number of the fuses 108 depends, at least in part, on a number of the input buffers 104 and a number of bits in each offset adjustment code. In some embodiments the fuses 108 store each of the offset adjustment codes. In such embodiments a minimum number of the fuses 108 is a product between the number of the input buffers 104 and the number of the bits in each offset adjustment code. In such embodiments, where the memory device 100 includes 1024 input buffers and uses two-bit offset adjustment codes the minimum number of the fuses 108 would be 2048 fuses. FIG. 2 illustrates an example of the memory device 100 where the fuses 108 store each of the offset adjustment codes.

FIG. 2 is a circuit schematic illustration of a memory device 200, which is an example of the memory device 100 of FIG. 1, according to some embodiments. The memory device 200 is similar to the memory device 100 of FIG. 1. For example, the memory device 200 includes input buffers 204 (input buffer 210, input buffer 212, input buffer 214, input buffer 216, input buffer 218) similar to the input buffers 104 of FIG. 1. The memory device 200 also includes control circuitry 206 including sets of offset latches 230 (set of offset latches 220, set of offset latches 222, set of offset latches 224, set of offset latches 226, set of offset latches 228) operably coupled to the input buffers 204. The sets of offset latches 230 are operably coupled to offset adjustment inputs of the input buffers 204. The sets of offset latches 230 are configured to store and provide, to the offset adjustment inputs of the input buffers 204, offset adjustment codes indicating compensation offset adjustments to the input buffers 204 to compensate for the offsets of the input buffers 204.

The memory device 200 also includes fuses 208 including the offset adjustment codes for each of the input buffers 204 stored thereon. For example, the fuses 208 may be configured to store the information shown below in Table 1.

TABLE 1

| | Offset Adjustment Code | |
|---|---|---|
| | Bit 0 | Bit 1 |
| Input Buffer 210 | DQ0-0 | DQ0-1 |
| Input Buffer 212 | DQ1-0 | DQ1-1 |
| Input Buffer 214 | DQ2-0 | DQ2-1 |
| Input Buffer 216 | DQ3-0 | DQ3-1 |
| . . . | . . . | . . . |
| Input Buffer 218 | DQM-0 | DQM-1 |

The fuses 208 are operably coupled to a shift register 202, which is operably coupled to the set of offset latches 220 and the clock signal 234. When the clock signal 234 cycles, the shift register 202 shifts the offset adjustment codes stored by the fuses 208, one bit per clock cycle, to the sets of offset latches 230 via a fuse output 232. The sets of offset latches 230 are operably coupled in series, and are each operably coupled to a clock signal 234. When the clock signal 234 cycles, the sets of offset latches 230 serially shift the offset adjustment codes along the sets of offset latches 230 from the set of offset latches 220 toward the set of offset latches 228. FIG. 2 shows a fuse output 232 provided by the shift register 202, in which bits DQM-1, DQM-0, . . . , DQ3-0, DQ2-1, DQ2-0, DQ1-1, DQ1-0, DQ0-1, and DQ0-0 corresponding to the offset adjustment codes stored in the fuses 208 are serially provided.

The sets of offset latches 230 in turn shift the offset adjustment codes received via the fuse output 232, one clock cycle at a time, from the set of offset latches 220 to the set of offset latches 228. FIG. 2 shows an example of the clock signal 234. The clock signal 234 includes clock cycles 1 through two times N (2N) (1, 2, 3, 4, 5, 6, 7, 2N−1, 2N), where N is the number of the input buffers 204 and the number of bits in each offset adjustment code is two. In embodiments where only a single bit is included in each offset adjustment code, N clock cycles would be used. In embodiments where a number X of bits are included in each offset adjustment code, XN clock cycles would be used (e.g., X may be any integer greater than or equal to one). The fuse output 232 includes bits DQ0-0, DQ0-1, DQ1-0, DQ1-1, DQ2-0, DQ2-1, DQ3-0, . . . , DQM-0, DQM-1 shifted by the shift register 202 to the sets of offset latches 230 at clock cycles 1, 2, 3, 4, 5, 6, 7, . . . , 2N−1, and 2N, respectively, where M is one less than N. After the 2N clock cycles, each of the sets of offset latches 230 includes the appropriate offset adjustment code corresponding to the one of the input buffers 204 that is coupled thereto.

Since the memory device 200 of FIG. 2 operates based on all the offset adjustment codes being stored by the fuses 208 and shifting serially from the fuses 208 to the sets of offset latches 230, a number of the fuses 208 is at least the number N of the input buffers 204 multiplied by the number of bits of each offset adjustment code. In the case where there are 1024 input buffers 204 (N=1024, M=1023) and two-bit offset adjustment codes are used, the fuses 208 include at least 2048 fuses 108 (1024*2=2048) dedicated to offset adjustment codes, which is a relatively large number of fuses 208. Not all the fuses 208, however, have offsets that are outside of an acceptable range of values.

Figure 3:
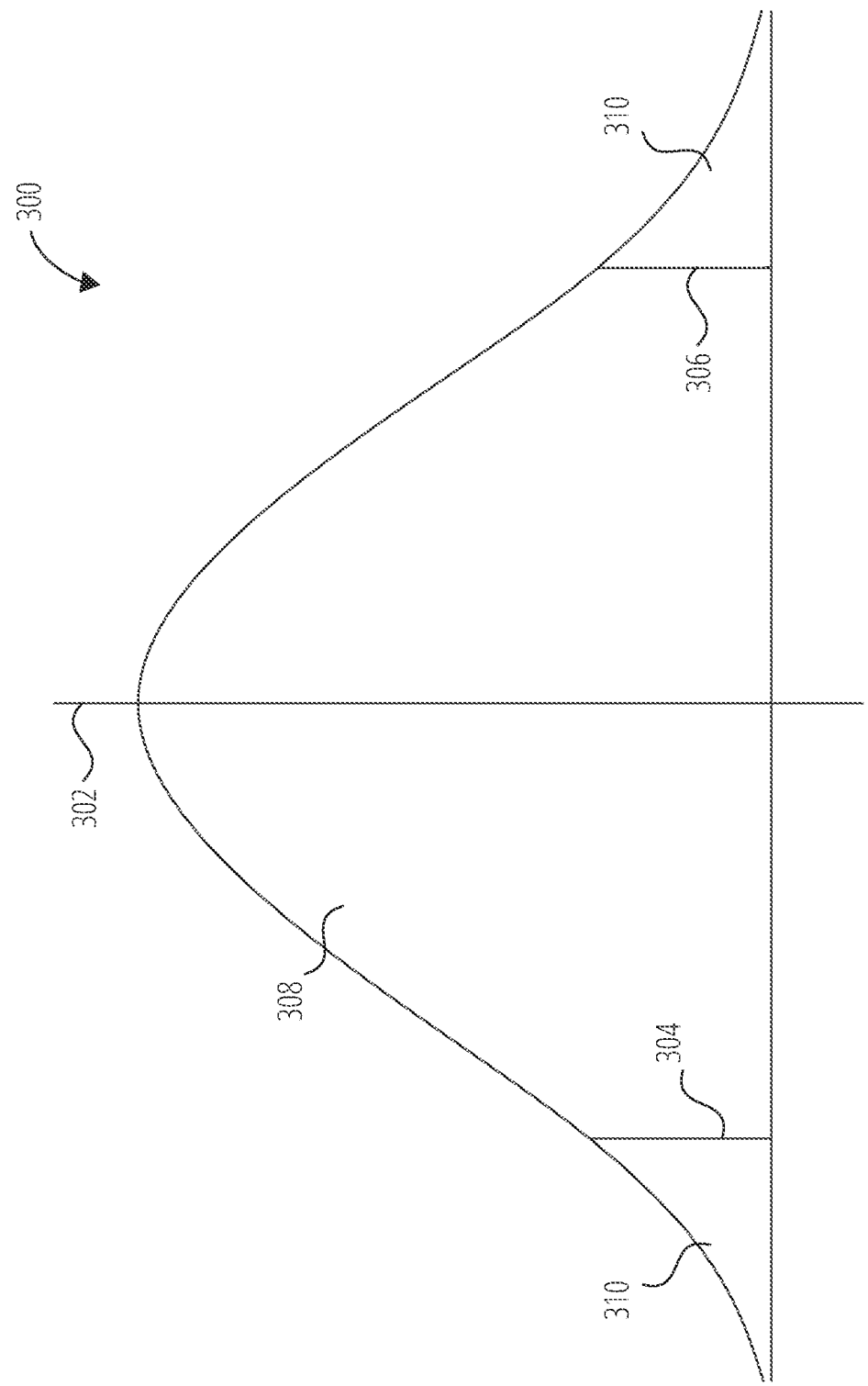
FIG. 3 is a histogram illustrating an example distribution of offsets of input buffers of a memory device, according to some embodiments.

FIG. 3 is a histogram 300 illustrating an example distribution of offsets of input buffers of a memory device (e.g., the memory device 100 of FIG. 1), according to some embodiments. The histogram 300 includes a zero offset marker 302, a minimum acceptable offset marker 304, and a maximum minimum acceptable offset marker 304. As can be seen by inspecting the histogram 300, most of the input buffers have acceptable offsets 308. Only a minority of the input buffers have unacceptable offsets 310, which are outside of an acceptable range of offsets defined by the minimum acceptable offset marker 304 and the maximum acceptable offset marker 306. By way of non-limiting example, an acceptable range of offsets may be between about −20 millivolts (mV) and +20 mV (though the acceptable range may depend on specific implementations of the disclosure).

In some embodiments, only about ten percent (10%) of the input buffers may have unacceptable offsets 310 (e.g., offsets outside of the acceptable range of offsets). As a result, in the memory device 200 of FIG. 2, assuming that only about 10% of the input buffers 204 have unacceptable offsets 310, ninety percent (90%) of fuses 208 are unnecessary because no offset adjustment codes are needed for 90% of the fuses 208.

Figure 4:
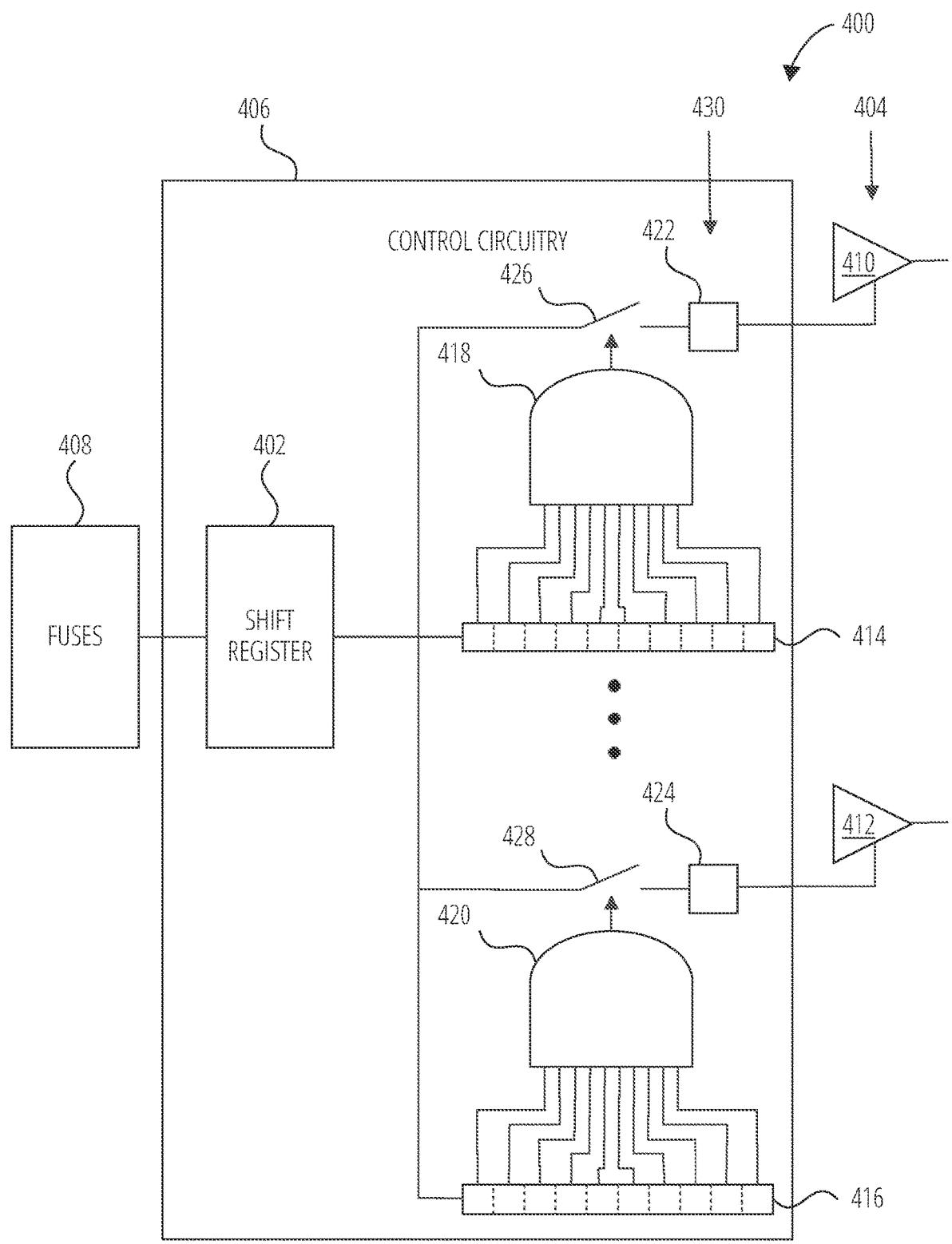
FIG. 4 is a circuit schematic illustration of a memory device, which is an example of the memory device of FIG. 1.
Figure 5:
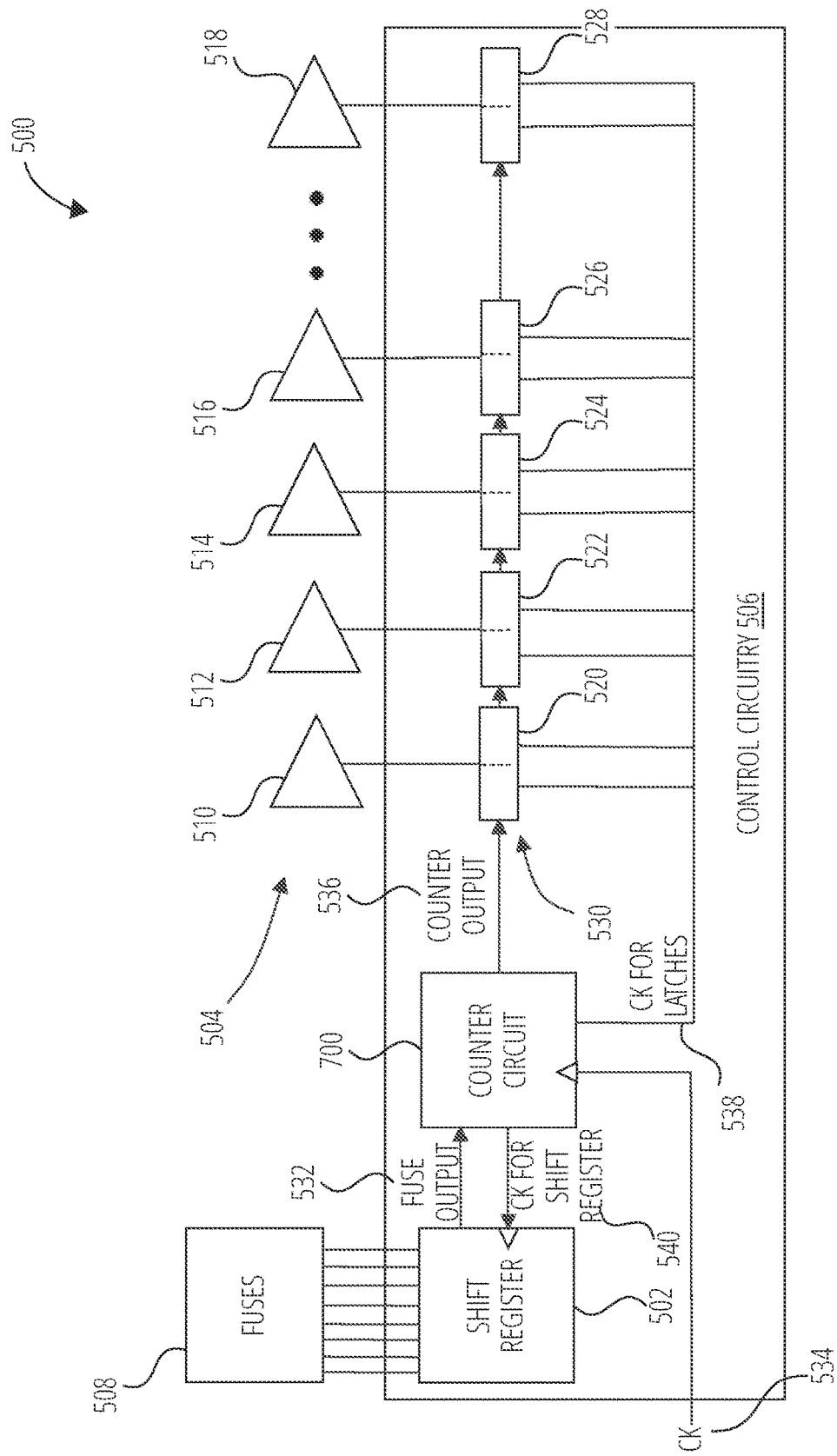
FIG. 5 is a circuit schematic illustration of a memory device, which is an example of the memory device of FIG. 1.

Referring once again to FIG. 1, in some embodiments the fuses 108 store only a subset of the offset adjustment codes. By way of non-limiting example, in instances when only 10% of the fuses 108 have unacceptable offsets 310 (FIG. 3), the fuses 108 may store only 10% of the offset adjustment codes. Accordingly, a number of the fuses 108 may be less than a product between the number of the input buffers 104 and the number of the bits in each offset adjustment code. In such embodiments, where the memory device 100 includes 1024 input buffers and uses two-bit offset adjustment codes the number of the fuses 108 would be less than 2048 fuses. FIG. 4 and FIG. 5 illustrate examples of the memory device 100 where the fuses 108 store less than all of the offset adjustment codes. In such embodiments the fuses 108 may store sets of offset information for those of the input buffers 104 that have unacceptable offsets 310. Each of the sets of offset information includes an offset adjustment code and latch selection information to enable the control circuitry 106 to provide the offset adjustment code to the appropriate one of the sets of offset latches 130. In some embodiments the latch selection information includes an identification code identifying which of the sets of offset latches 130 corresponds to the offset adjustment code (e.g., FIG. 4). In some embodiments the latch selection information includes a skip code indicating a number of the sets of offset latches 130 in an ordered sequence of the sets of offset latches 130 to skip to obtain a position of the appropriate set of offset latches that corresponds to the offset adjustment code.

FIG. 4 is a circuit schematic illustration of a memory device 400, which is an example of the memory device 100 of FIG. 1. The memory device 400 includes input buffers 404 (e.g., input buffer 410, . . . , input buffer 412) similar to the input buffers 104 of FIG. 1, fuses 408 similar to the fuses 108 of FIG. 1, and control circuitry 406 operably coupled between the fuses 408 and the input buffers 404. The control circuitry 406 includes sets of offset latches 430 (set of offset latches 422, set of offset latches 424) similar to the sets of offset latches 130 of FIG. 1. The sets of offset latches 430 are operably coupled to offset adjustment inputs of the input buffers 404 to adjust the offsets of those of a subset of the input buffers 404 that have unacceptable offsets 310 (FIG. 3). Each of the sets of offset latches 430 has an identification code associated therewith.

The fuses 408 include stored thereon, for each input buffer of the subset of the input buffers 404 having unacceptable offsets 310, an offset adjustment code and an identification code associated with one of the input buffers 404 and the set of offset latches (e.g., set of offset latches 422, set of offset latches 424) that is operably coupled thereto. For example, the fuses 408 may include the offset information illustrated in Table 2 below:

TABLE 2

| | Offset Adjustment Code | | Identification Code | | |
|---|---|---|---|---|---|
| | Bit 0 | Bit 1 | Bit 1 | Bit 2 | . . . Bit Y |
| Input Buffer 410 | DQ0-0 | DQ0-1 | ID0-1 | ID0-2 | . . . ID0-Y |
| . . . | . . . | . . . | . . . | . . . | . . . . . . |
| Input Buffer 412 | DQM-0 | DQM-1 | IDM-1 | IDM-2 | . . . IDM-Y |

Table 2 includes a total of M+1 sets of offset information (M+1 sets of offset adjustment codes and identification codes). Also, the offset adjustment codes of Table 2 are two-bit offset adjustment codes. Further, the identification codes of Table 2 are Y bit offset adjustment codes, where Y=roundup($\log_2(N)$) (e.g., N=1024 case, Y=10). Those of the sets of offset latches 430 corresponding to input buffers 404 that are outside of the subset associated with the offset information stored by the fuses 408 may be set, by default, to a zero offset adjustment value to control the corresponding ones of the input buffers 404 to have zero offset adjustments as they have acceptable offsets 308 (FIG. 3).

The control circuitry 406 includes a shift register 402 operably coupled to the fuses 408. In some embodiments this shift register 402 may be included in a fuse block or fuse array apparatus that includes the fuses 408. The shift register 402 is configured to serially provide the identification codes and the offset adjustment codes, bit by bit, responsive to cycling of a clock signal (not shown). The control circuitry 406 includes switch circuitry including switches (switch 426, switch 428) operably coupled between the shift register 402 and the sets of offset latches 430, and switch control logic (switch control logic 418, . . . , switch control logic 420) operably coupled to sets of identification latches (set of identification latches 414, . . . , set of identification latches 416). The sets of identification latches (414, 416) are operably coupled to the shift register 402 to receive the identification codes provided by the shift register 402. The sets of identification latches are also operably coupled to a clock signal (not shown) to enable bits of the identification codes to be shifted from the shift register 402 along the sets of identification latches. Each switch control logic is configured to selectively switch its corresponding switch (e.g., switch control logic 418 corresponding to switch 426, . . . , switch control logic 420 corresponding to switch 428) to operably couple the corresponding one of the sets of offset latches 430 to the shift register 402 responsive to its set of identification latches receiving its identification code. With the appropriate switch closed, the appropriate one of the offset adjustment codes is transmitted to the appropriate one of the sets of offset latches 430.

By way of non-limiting example, the shift register 402 may provide the identification code associated with the set of offset latches 422 to the sets of identification latches (set of identification latches 414, set of identification latches 416). Since only the switch control logic 418 is programmed to control its switch (switch 426) to close responsive to the identification code associated with the set of offset latches 422, the switch control logic 418 closes switch 426, and the other switch control logics (e.g., switch control logic 420) keep their corresponding switches (e.g., switch 428) open. With the switch 426 closed, the offset adjustment code corresponding to the input buffer 410 is provided to the set of offset latches 422, adjusting the offset of input buffer 410 to the appropriate level.

Also by way of non-limiting example, the shift register 402 may provide the identification code associated with the set of offset latches 424 to the sets of identification latches (set of identification latches 414, set of identification latches 416). Since only the switch control logic 420 is programmed to control its switch (switch 428) to close responsive to the identification code associated with the set of offset latches 424, the switch control logic 420 closes switch 428, and the other switch control logics (e.g., switch control logic 418) keep their corresponding switches (e.g., switch 426) open. With the switch 428 closed, the offset adjustment code corresponding to the input buffer 412 is provided to the set of offset latches 424, adjusting the offset of input buffer 412 to the appropriate level.

In one specific non-limiting example, a total number of input buffers 404 may be 1024, and a total number of these input buffers 404 that have unacceptable offsets 310 may be about 10% of the input buffers 404, which is about one hundred of the input buffers 404 having unacceptable offsets 310. Accordingly, the total number of sets of offset information stored in the fuses 408 may be about 100 (e.g., M=99). Since the total number of input buffers 404 is 1024, ten-bit identification codes are needed to provide a unique identification code to each one of the 1024 input buffers 404 ($2^{10}$=1024). Although the fuses 408 in this example store twelve total bits per input buffer (assuming two-bit offset adjustment codes), only 100 sets of offset information are stored, totaling 1200 total bits (100 sets of information times 12 bits per set of information is 1200). Accordingly, in this example the appropriate offsets may be provided to each of the input buffers 404 using just 1200 fuses to store the offset information. In contrast, the memory device 200 would store 2048 bits of offset adjustment codes (2 bits multiplied by 1024 input buffers 204 is 2048 bits) in its fuses 208, and would use at least 2048 fuses to store the offset adjustment codes (FIG. 2). As a result, even though a larger number of bits per input buffer is stored by the fuses 408 of FIG. 4 as compared to the fuses 208 of FIG. 2 (e.g., compare Table 1 to Table 2), the fuses 408 of FIG. 4 store fewer total bits of information because the fuses 408 stores offset information for only a minority of the input buffers 404. So long as the following inequality holds true, the memory device 400 uses fewer fuses 408 than the fuses 208 that would be used by the memory device 200:

$$P < \frac{N_{bits}\log(2)}{N_{bits}lo(2) + lo(N_{buffs})},$$

where $N_{bits}$ is the number of bits in each offset adjustment code, $N_{buffs}$ is the total number of input buffers 404, and P is the ratio between a number of the input buffers 404 having unacceptable offsets 310 and the total number $N_{buffs}$ of the input buffers 404. In the example where $N_{bits}=2$ and $N_{buffs}=1024$, the input buffers 404 uses fewer fuses 408 than the fuses 208 of the memory device 200 if P is less than 0.1667 (16.67%).

FIG. 5 is a circuit schematic illustration of a memory device 500, which is an example of the memory device 100 of FIG. 1. The memory device 500 includes input buffers 504 (e.g., input buffer 510, input buffer 512, input buffer 514, input buffer 516, input buffer 518) similar to the input buffers 104 of FIG. 1, fuses 508 similar to the fuses 108 of FIG. 1, and control circuitry 506 operably coupled between the fuses 508 and the input buffers 504. The control circuitry 506 includes sets of offset latches 530 (set of offset latches 520, set of offset latches 522, set of offset latches 524, set of offset latches 526, set of offset latches 528) similar to the sets of offset latches 130 of FIG. 1. The sets of offset latches 530 are operably coupled to offset adjustment inputs of the input buffers 504 to adjust the offsets of those of a subset of the input buffers 504 that have unacceptable offsets 310 (FIG. 3). The sets of offset latches 530 have an ordered sequence associated therewith. Each one of the sets of offset latches 530 has a position of the ordered sequence associated therewith. The sets of offset latches 530 are operably coupled in series according to the ordered sequence.

The fuses 508 include stored thereon, for each input buffer of the subset of the input buffers 504 having unacceptable offsets 310, a set of offset information associated with one of the input buffers 504 and one of the sets of offset latches 530 that is operably coupled thereto. Each of the sets of offset information includes an offset adjustment code and a skip code. The skip codes indicate numbers of the sets of offset latches 530 to skip in the ordered sequence to obtain positions of those of the sets of offset latches 530 associated with input buffers 504 having unacceptable offsets 310. For example, the fuses 508 may include the offset information illustrated in Table 3 below:

TABLE 3

| | Offset Adjustment Code | | Skip Code | | | |
|---|---|---|---|---|---|---|
| | Bit 0 | Bit 1 | Bit 1 | Bit 2 | ... | Bit Z |
| Input Buffer 510 | DQ0-0 | DQ0-1 | SC0-1 | SC0-2 | ... | SC0-Z |
| Input Buffer 512 | DQ1-0 | DQ1-1 | SC1-1 | SC1-2 | ... | SC1-Z |
| Input Buffer 514 | DQ2-0 | DQ2-1 | SC2-1 | SC2-2 | ... | SC2-Z |
| Input Buffer 516 | DQ3-0 | DQ3-1 | SC3-1 | SC3-2 | ... | SC3-Z |
| ... | ... | ... | ... | ... | ... | ... |
| Input Buffer 518 | DQM-0 | DQM-1 | SCM-1 | SCM-2 | ... | SCM-Z |

Table 3 includes a total of M+1 sets of offset information (M+1 sets of offset adjustment codes and skip codes). Also, the offset adjustment codes of Table 3 are two-bit offset adjustment codes. Further, the skip codes of Table 3 are Z bit offset adjustment codes.

The control circuitry 506 includes a shift register 502 operably coupled to the fuses 508. The shift register 502 is configured to serially provide a fuse output 532 including the offset adjustment codes and the skip codes, provided bit by bit, responsive to cycling of a clock signal 540 for shift register received from a counter circuit 700. The shift register 502 is configured to provide the fuse output 532 to the counter circuit 700.

The control circuitry 506 also includes the counter circuit 700. The counter circuit 700 is configured to receive a clock signal 534, provide the clock signal 540 to the shift register 502, and provide a counter output 536 including a serial stream of the offset adjustment codes to the sets of offset latches 530. The counter circuit 700 is also configured to provide a clock signal 538 intended for cycling the latches. The counter circuit 700 is configured to use the clock signal 538 to serially shift bits provided at the counter output 536 along the sets of offset latches 530 from the set of offset latches 520 to the set of offset latches 528. Accordingly, the counter circuit 700 is configured to control the flow of bits from the shift register 502 and through the sets of offset latches 530.

The counter circuit 700 is configured to provide, to the sets of offset latches 530 via the counter output 536, a zero offset adjustment code a number of times that is responsive to a number of sets of offset latches indicated by a skip code. The counter circuit 700 is also configured to provide, to the sets of offset latches 530 via the counter output 536, the offset adjustment code after providing the number of zero offset adjustment codes. More detail regarding an example of the counter circuit 700 will be discussed below with reference to FIG. 7.

The number of bits in each skip code dictates the number of the sets of offset latches 530 and their corresponding input buffers 504 that may be skipped between sets of offset latches 530 that are given non-zero offset adjustment codes. For example, where each skip code includes eight bits, a total number of the sets of offset latches 530 and their corresponding input buffers 504 that may be skipped is 256.

Figure 6:
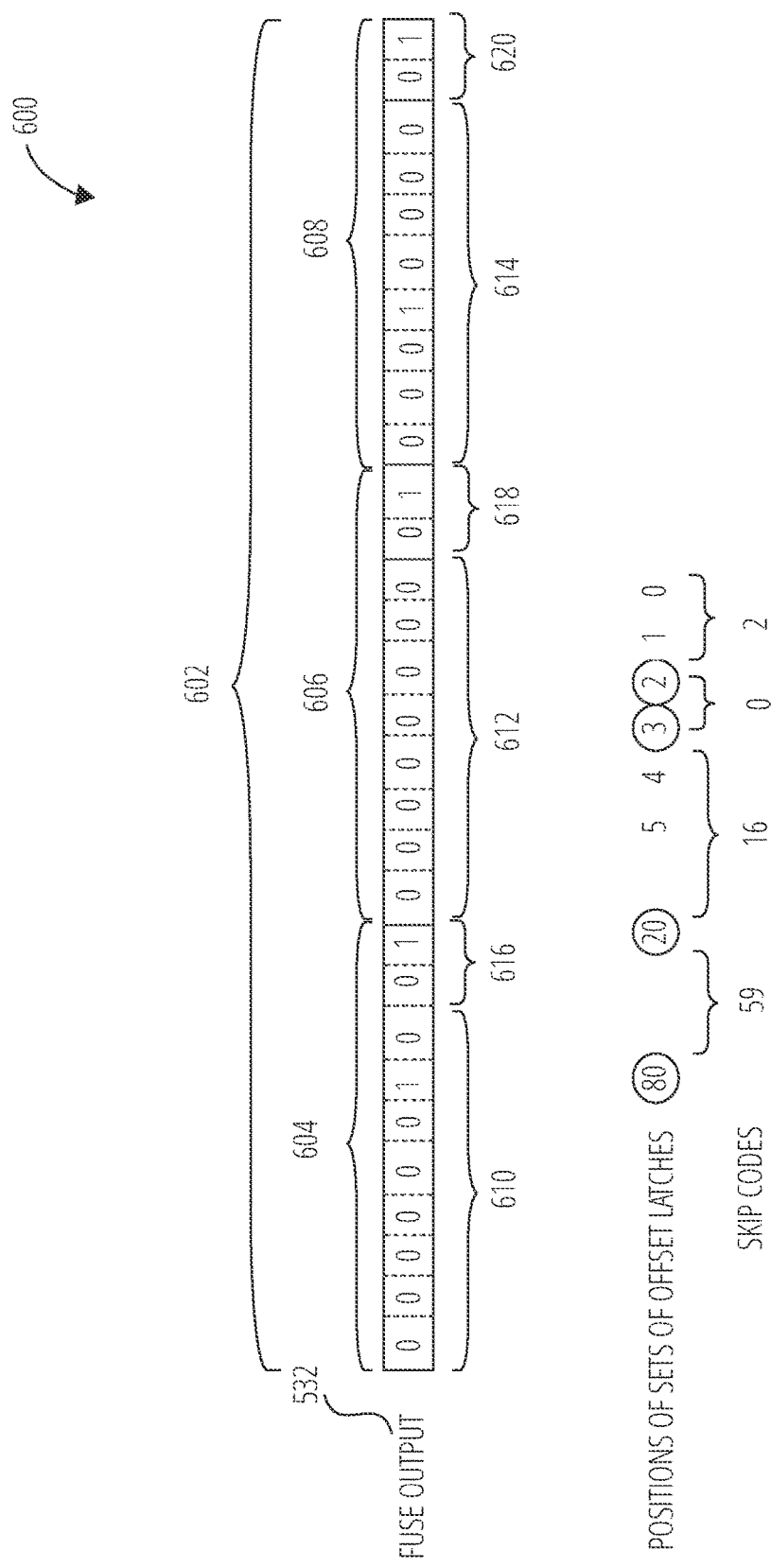
FIG. 6 is an example scenario illustrating an operational example of the counter circuit of the memory device of FIG. 5.

FIG. 6 is an example scenario 600 illustrating an operational example of the counter circuit 700 of the memory device 500 of FIG. 5. Referring to FIG. 5 and FIG. 6 together, the scenario 600 includes an example fuse output 532 including sets of offset information 602 (e.g., set of offset information 604, set of offset information 606, set of offset information 608). The set of offset information 604 includes a skip code 610 set to the number 2 (00000010) and an offset adjustment code 616 set to "01." As a result, sets of offset latches at positions 0 and 1 (corresponding to the end of the line of the sets of offset latches 530) are skipped (i.e., set to zero offset adjustment codes), and the set of offset latches at position 2 (circled to indicate that it is not skipped) is set to the offset adjustment code 616 "01."

The set of offset information 606 includes a skip code 612 of 0 (00000000) and an offset adjustment code 618 of "01." As a result of the skip code 612 being set to 0, no sets of offset latches are skipped, and the set of offset latches at position 3 (circled to indicate that it is not skipped) is set to the offset adjustment code 618 "01."

The set of offset information 608 includes a skip code 614 of 16 (00010000) and an offset adjustment code 620 set to "01." As a result of the skip code 614 being set to 16, 16 sets of offset latches at positions 4 through 19 are skipped (i.e., set to zero offset adjustment codes), and the set of offset latches at position 20 (circled to indicate that it is not skipped) is set to the offset adjustment code 620 "01."

Although not shown, a next one of the sets of offset information 602 may include a skip code of 59. Accordingly, 59 sets of offset latches at positions 21 through 79 may be skipped (i.e., set to zero offset adjustment codes), and the set of offset latches at position 80 (circled to indicate that it is not skipped) is set to a value indicated by the offset adjustment code indicated by the sets of offset information 602. The sets of offset information 602 may continue until the sets of offset latches 530 are filled with offset adjustment codes.

Figure 7:
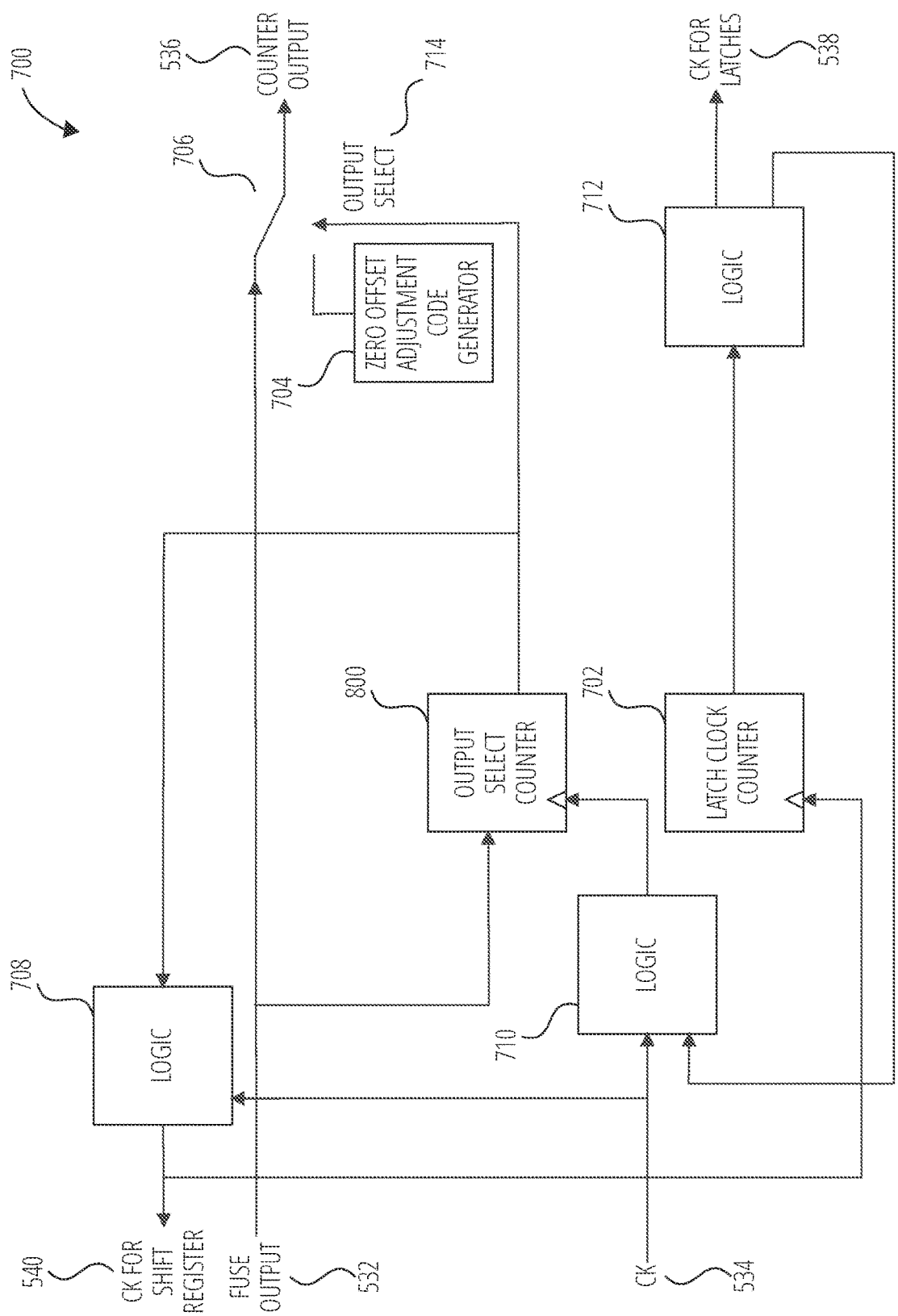
FIG. 7 is a mixed schematic illustration of a counter circuit of the memory device of FIG. 5, according to some embodiments.

FIG. 7 is a mixed schematic illustration of a counter circuit 700 of the memory device 500 of FIG. 5, according to some embodiments. Referring to FIG. 5 and FIG. 7 together, the counter circuit 700 is configured to receive the fuse output 532 and the clock signal 534, and provide the clock signal 540 for the shift register, the clock signal 538 for the latches, and the counter output 536. The counter circuit 700 includes an output select counter 800, a latch clock counter 702, a zero offset adjustment code generator 704, an output select switch 706, logic 708, logic 710, and logic 712. The number of bits of the output select counter 800 is equal to the number of bits of the skip code plus one the number of bits of the offset adjustment code minus one. By way of non-limiting example, where eight-bit skip codes and two-bit offset adjustment codes are used, the output select counter 800 includes a nine-bit counter and the latch clock counter 702 includes a four-bit counter.

The output select counter 800 is configured to selectively control the output select switch 706 to operably couple the counter output 536 to the fuse output 532 and the zero offset adjustment code generator 704 using an output select signal 714. The output select switch 706 is controllable via the output select signal 714 provided by the output select counter 800. During periods of time when the logic 708 controls the clock signal 540 for shift register to cause the shift register 502 to output offset adjustment code bits (following a corresponding skip code indicating a number of the sets of offset latches 530 to skip to obtain a position of the corresponding set of latches), the output select counter 800 controls the output select switch 706 to operably couple the counter output 536 to the fuse output 532 and conduct the offset adjustment code bits to the counter output 536. During periods of time when the counter circuit 700 is providing zero offset adjustment codes, the output select counter 800 controls the output select switch 706 to operably couple the counter output 536 to the zero offset adjustment code generator 704. More detail regarding the output select counter 800 is discussed below with respect to FIG. 8.

In some embodiments the zero offset adjustment code generator 704 includes a reference voltage set to a low power supply voltage potential level (e.g., VSS, ground, etc.). For example, in embodiments where the zero offset adjustment code is a series of zeros (e.g., "00" for a two-bit zero offset adjustment code), the zero offset adjustment code generator 704 may be a connection to VSS, and the counter output 536 will be set to zeros when the output select switch 706 couples the counter output 536 to the zero offset adjustment code generator 704.

The latch clock counter 702 is configured to count up as the shift register outputs bits of a skip code. When the latch clock counter 702 has counted up to the end of the skip code (e.g., 1 through 7 corresponding to an eight-bit skip code), the logic 708 controls the clock signal 540 for shift register to stop cycling. With the output select switch 706 set to operably couple the zero offset adjustment code generator 704 to the counter output 536 the logic 712 controls the clock signal 538 for latches to cycle. The logic 712 controls the clock signal 538 to cycle a sufficient number of times to shift sufficient bits to the sets of offset latches 530 to cover the number of zero offset adjustment codes indicated by the skip code, shifting the number of zero offset adjustment codes indicated by the skip code to the sets of offset latches 530. The output select counter 800 counts down until the number of zero offset adjustment codes indicated by the skip code is shifted to the sets of offset latches 530, at which point the output select counter 800 uses the output select signal 714 to control the output select switch 706 to operably couple the fuse output 532 to the counter output 536. The logic 708 controls the clock signal 540 to cycle, providing bits of an offset adjustment code to the counter output 536, and the logic 712 continues to cycle the clock signal 538 for latches to shift the offset adjustment code to the sets of offset latches 530. The latch clock counter 702 counts the bits of the offset adjustment code until the end of the offset adjustment code is reached, at which point the logic 712 controls the clock signal 538 to stop cycling and the latch clock counter 702 is reset. This process is then repeated for each set of offset information stored in the fuses 508.

Figure 8:
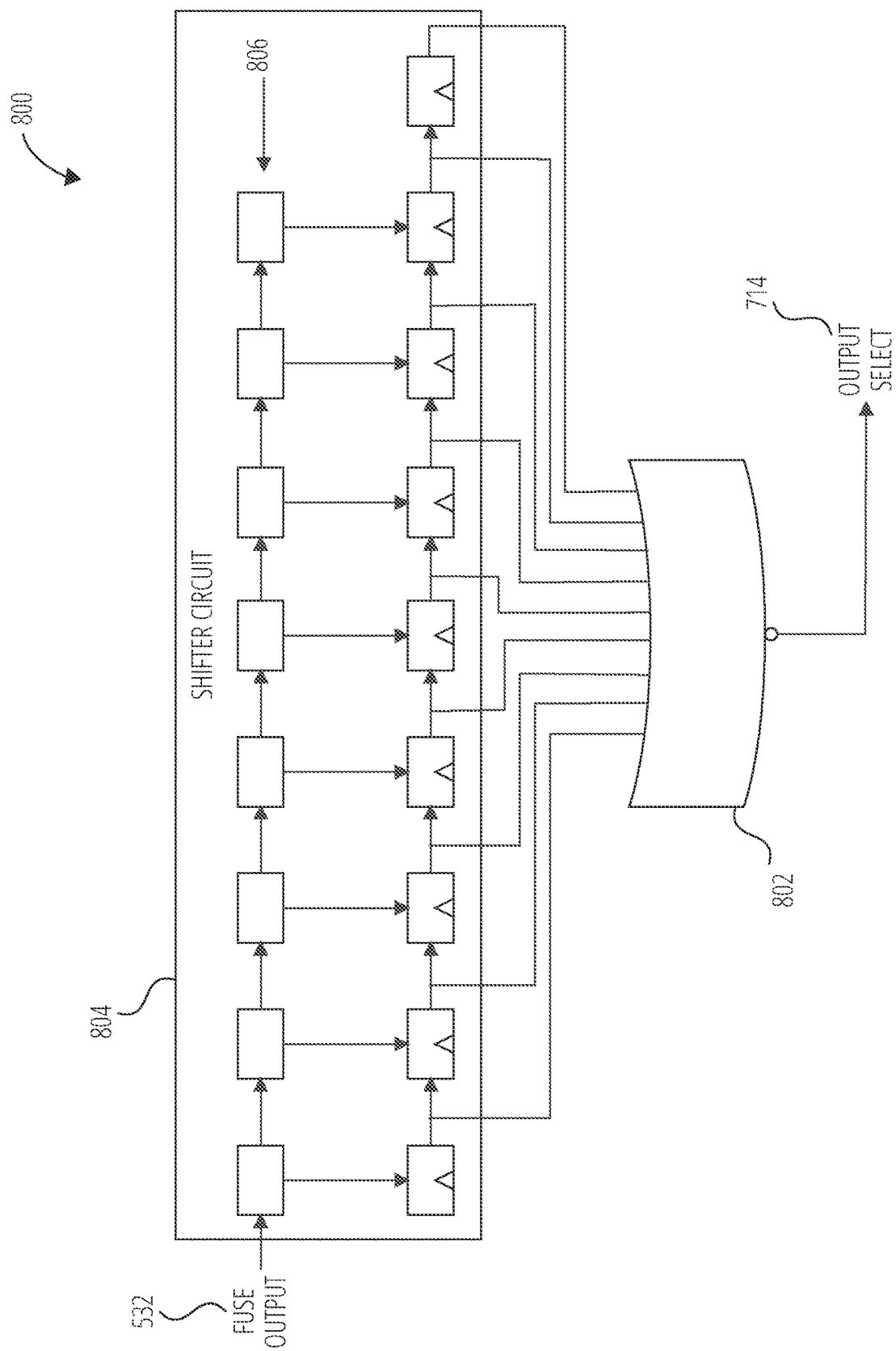
FIG. 8 is a circuit schematic illustration of an output select counter of the counter circuit of FIG. 7, according to some embodiments.

FIG. 8 is a circuit schematic illustration of an output select counter 800 of the counter circuit 700 of FIG. 7, according to some embodiments. The output select counter 800 includes a shifter circuit 804 (e.g., an eight-bit shifter) operably coupled to logic 802. The output select counter 800 is configured to count down a number of bits corresponding to a number of zero offset adjustment codes indicated by a skip code. The skip code may be provided to counter latches 806, and the countdown may be triggered by the latch clock counter 702 when the latch clock counter 702 reaches the end of the count for the skip code.

Figure 9:
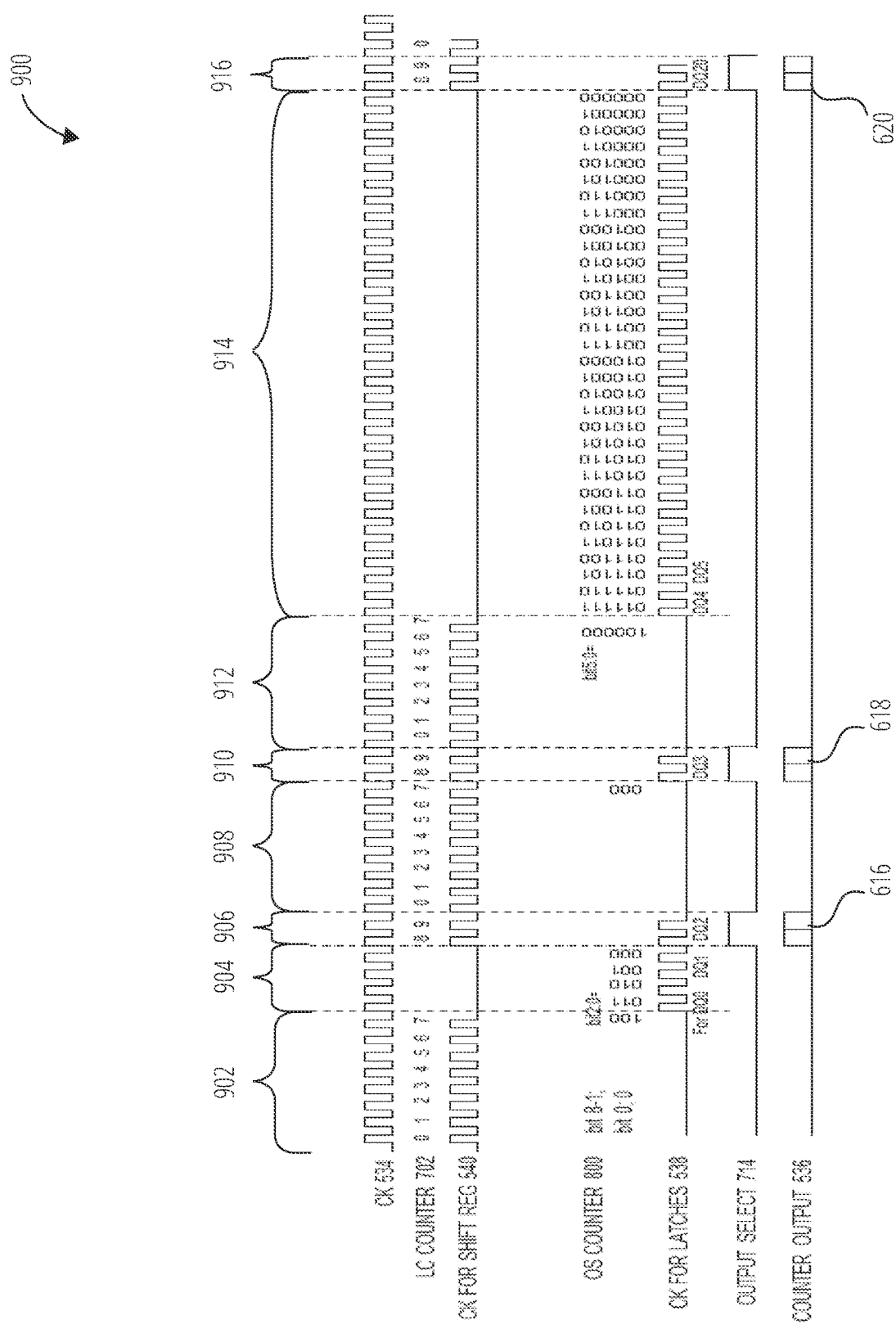
FIG. 9 is a signal timing diagram for the memory device of FIG. 5 and the counter circuit of FIG. 7 during the example scenario of FIG. 6.

FIG. 9 is a signal timing diagram 900 for the memory device 500 of FIG. 5 and the counter circuit 700 of FIG. 7 during the example scenario 600 of FIG. 6. Referring to FIG. 5, FIG. 6, FIG. 7, and FIG. 9 together, the signal timing diagram 900 results from the sets of offset information 602 applied to the fuse output 532. This example is based on an implementation using eight-bit skip codes and two-bit offset adjustment codes. It will be apparent to those of ordinary skill that other numbers of bits of the skip codes and the offset adjustment codes may be used without departing from the scope of the disclosure.

During period of time 902 the clock signal 538 for latches is disabled and the clock signal 540 for shift register is enabled to cycle, causing the shift register 502 to provide bits of the skip code 610 (00000010, or 2 in decimal). The latch clock counter 702 counts up (e.g., from 0 to 7; this number is determined by the skip code) responsive to the clock signal 540 for shift register. The output select signal 714 is unasserted, controlling the output select switch 706 to operably couple the zero offset adjustment code generator 704 to the counter output 536. When the latch clock counter 702 finishes counting up the skip code 610 is provided to the output select counter 800.

During period of time 904 the output select signal 714 remains unasserted and the counter output 536 remains operably coupled to the zero offset adjustment code generator 704. The clock signal 540 for shift register is disabled, the latch clock counter 702 stops counting up, and the output select counter 800 counts down until 2 zero offset adjustment codes have been shifted to the input buffers 504 (e.g., four total bits). As previously discussed, in the example case in which each skip code includes eight bits, 255 skips are available. When the skip number is greater than 256, two sets of eight fuses may be used. For the first of these two sets of fuses, the offset adjustment code may be set to "00" and the skip code may be set to "11111111." For the second of these two sets of fuses, the offset adjustment code may be set to a target value and the skip code may be set to the skip number −255. For example, DQ0-DQ259 may not change the offset adjustment code, and DQ260 may be set to 01, then skip code 610 (FIG. 6) may be set to 11111111, offset adjustment code 616 may be set to 00, skip code 612 may be set to 00000101 (260−255=5), and offset adjustment code 618 may be set to 01. The value of skip code 610 and offset adjustment code 616 make the offset adjustment code of DQ255=00. This means the offset of DQ255 doesn't change and having a large number of skips (e.g., larger than a number available based on the number of bits in each skip code) becomes available.

During period of time 906 the output select signal 714 is asserted, operably coupling the fuse output 532 to the counter output 536. The clock signal 540 for shift register is enabled to cycle and the clock signal 538 keeps cycling, shifting the offset adjustment code 616 (01) to the sets of offset latches 530 via the counter output 536. The latch clock counter 702 counts up until the end of the offset adjustment code 616 (e.g., 8 to 9; this number is determined by the offset adjustment code), at which point the latch clock counter 702 is reset. The LC counter bit width>=$\log_2$ (number of bits of the skip code+number of bits of the offset adjustment code). Following the example case discussed above, $\log_2(8+2)$ →LC counter bit width=4.

During period of time 908 the output select signal 714 is unasserted, operably coupling the zero offset adjustment code generator 704 to the counter output 536. The clock signal 538 for latches is disabled while the clock signal 540 for shift register remains cycling, causing the shift register 502 to provide bits of the skip code 612 (00000000, or 0 in decimal). The latch clock counter 702 counts up (e.g., from 0 to 7) responsive to the clock signal 540 for shift register. When the latch clock counter 702 finishes counting up the skip code 612 is provided to the output select counter 800. Since the skip code 612 is 0, no zero offset adjustment codes are shifted to the sets of offset latches 530 via the counter output 536.

During period of time 910 the output select signal 714 is asserted, operably coupling the fuse output 532 to the counter output 536. The clock signal 540 for shift register remains cycling and the clock signal 538 for latches is enabled to cycle, shifting the offset adjustment code 618 to the sets of offset latches 530 via the counter output 536. The latch clock counter 702 counts up until the end of the offset adjustment code 616 (e.g., 8 to 9), at which point the latch clock counter 702 is reset.

During period of time 912 the output select signal 714 is unasserted, operably coupling the zero offset adjustment code generator 704 to the counter output 536. The clock signal 538 for latches is disabled while the clock signal 540 for shift register remains cycling, causing the shift register 502 to provide bits of the skip code 614 (00010000, or 16 in decimal). The latch clock counter 702 counts up (e.g., from 0 to 7) responsive to the clock signal 540 for shift register. When the latch clock counter 702 finishes counting up the skip code 614 is provided to the output select counter 800.

During period of time 914 the output select signal 714 remains unasserted and the counter output 536 remains operably coupled to the zero offset adjustment code generator 704. The clock signal 540 for shift register is disabled, the latch clock counter 702 stops counting up, and the output select counter 800 counts down until 16 zero offset adjustment codes have been shifted to the input buffers 504 (e.g., 32 total bits).

During period of time 916 the output select signal 714 is asserted, operably coupling the fuse output 532 to the counter output 536. The clock signal 540 for shift register is enabled to cycle and the clock signal 538 keeps cycling, shifting the offset adjustment code 620 (01) to the sets of offset latches 530 via the counter output 536. The latch clock counter 702 counts up until the end of the offset adjustment code 616 (e.g., 8 to 9), at which point the latch clock counter 702 is reset.

Figure 10:
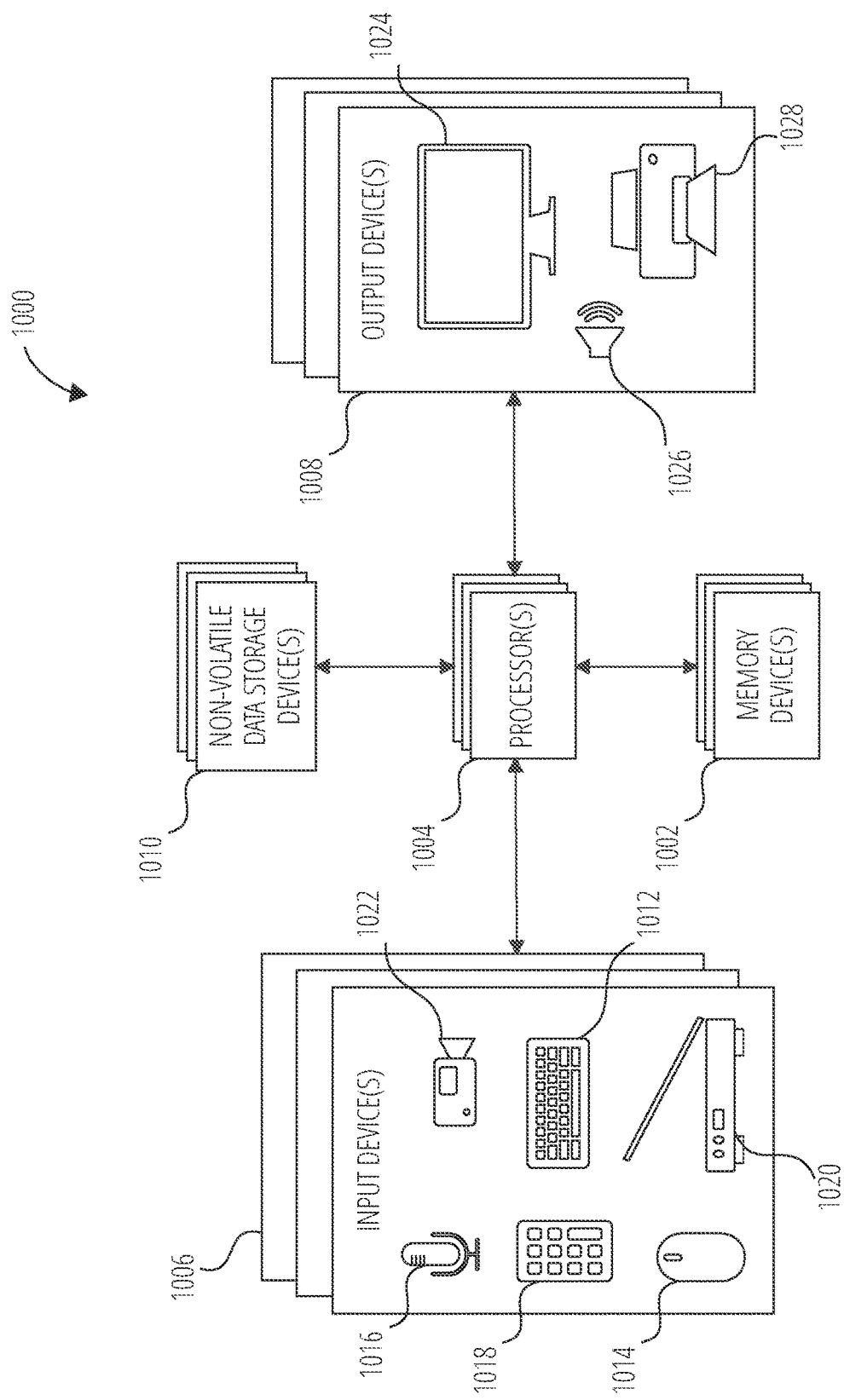
FIG. 10 is a block diagram of a computing system, according to some embodiments.

FIG. 10 is a block diagram of a computing system 1000, according to some embodiments. The computing system 1000 includes one or more processors 1004 operably coupled to one or more memory devices 1002, one or more non-volatile data storage devices 1010, one or more input devices 1006, and one or more output devices 1008. In some embodiments the computing system 1000 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 1004 may include a central processing unit (CPU) or other processor configured to control the computing system 1000. In some embodiments the one or more memory devices 1002 include random access memory (RAM), such as volatile data storage (e.g., dynamic RAM (DRAM) static RAM (SRAM), etc.). In some embodiments the one or more non-volatile data storage devices 1010 include a hard drive, a solid state drive, Flash memory, erasable programmable read only memory (EPROM), other non-volatile data storage devices, or any combination thereof. In some embodiments, at least one of the memory devices 1002 or the non-volatile data storage devices 1010 include any one or more of the memory device 200, the memory device 400, and the memory device 500. In some embodiments the one or more input devices 1006 include a keyboard 1012, a pointing device 1014 (e.g., a mouse, a track pad, etc.), a microphone 1016, a keypad 1018, a scanner 1020, a camera 1022, other input devices, or any combination thereof. In some embodiments the output devices 1008 include an electronic display 1024, a speaker 1026, a printer 1028, other output devices, or any combination thereof.

In some embodiments an apparatus includes buffers. Each of the buffers includes an output and an offset adjustment input. Each of the buffers is controllable to adjust a direct current offset of an output voltage potential responsive to an offset adjustment code provided to the offset adjustment input. The electronic device also includes control circuitry including sets of offset latches. The offset adjustment input of each of the buffers is operably coupled to a different one of the sets of offset latches. Each set of offset latches configured to provide the offset adjustment code to the offset adjustment input of a corresponding buffer. The electronic device further includes fuses. The fuses are operably coupled to the control circuitry. The fuses are configured to provide the offset adjustment code to each of a subset of the sets of offset latches.

In some embodiments an apparatus includes input buffers, fuses, and control circuitry. The input buffers include offset adjustment inputs. The input buffers are configured to adjust direct current offsets of outputs of the input buffers responsive to offset adjustment codes provided to the offset adjustment inputs. The fuses are configured to store only a subset of the offset adjustment codes that corresponds to non-zero offset adjustments; and. The control circuitry is operably coupled to the fuses and the offset adjustment inputs of the input buffers. The control circuitry is configured to provide the subset of the offset adjustment codes to the offset adjustment inputs of the corresponding input buffers.

In some embodiments a computing system includes a memory device including input buffers, fuses, and control circuitry. The input buffers are associated with an ordered sequence. The input buffers are associated with positions in the ordered sequence. The input buffers include offset adjustment inputs. The input buffers are configured to adjust direct current offsets of outputs of the input buffers responsive to offset adjustment codes provided to the offset adjustment inputs. The fuses are configured to store only a subset of the offset adjustment codes that corresponds to non-zero offset adjustments. The fuses are further configured to store skip codes associated with the offset adjustment codes. The skip codes are configured to indicate numbers of input buffers, in the ordered sequence, between the input buffers corresponding to the subset of offset adjustment codes. The control circuitry is operably coupled to the fuses and the offset adjustment inputs of the input buffers. The control circuitry is configured to provide the subset of the offset adjustment codes to the offset adjustment inputs of the corresponding input buffers responsive to the skip codes.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   buffers, each of the buffers including an output and an offset adjustment input, each of the buffers controllable to adjust a direct current offset of an output voltage potential at the output responsive to an offset adjustment code provided to the offset adjustment input; and
   control circuitry configured to provide the offset adjustment code to the offset adjustment input of each of the buffers.

2. The apparatus of claim 1, further comprising fuses operably coupled to the control circuitry, the fuses configured to store offset adjustment codes for at least a subset of the buffers and provide the offset adjustment codes to the control circuitry.

3. The apparatus of claim 2, wherein the offset adjustment codes for the at least the subset of the buffers include offset adjustment codes for each of the buffers.

4. The apparatus of claim 2, wherein:
the offset adjustment codes for the at least the subset of the buffers include non-zero offset adjustment codes for only a first subset of the buffers, the non-zero offset adjustment codes indicating non-zero offset adjustment of the direct current offset of the output voltage potential at each of the first subset of the buffers; and
the control circuitry is configured to provide zero offset adjustment codes to offset adjustment inputs of a second subset of the buffers, the zero offset adjustment codes indicating zero offset adjustment of the direct current offset of the output voltage potential at each of the second subset of the buffers.

5. The apparatus of claim 2, wherein a number of the fuses is less than a product between a number of the buffers and a number of bits in the offset adjustment codes.

6. The apparatus of claim 2, wherein the fuses are further configured to store identification codes associated with the offset adjustment codes stored by the fuses, the identification codes configured to indicate which of the buffers the offset adjustment codes should be provided to.

7. The apparatus of claim 2, wherein the fuses are further configured to store skip codes associated with the offset adjustment codes, the skip codes indicating numbers of the buffers to skip in an ordered sequence of the buffers to identify the buffers the offset adjustment codes should be provided to.

8. The apparatus of claim 1, wherein offset adjustment codes are multiple bit offset adjustment codes to accommodate more than two offset values of the offset adjustment code.

9. A method of adjusting direct current offsets of output voltage potentials at outputs of buffers, the method comprising:
providing offset adjustment codes to offset adjustment inputs of the buffers, the offset adjustment codes indicating amounts of offset adjustment to be applied to the output voltage potentials at the outputs of the buffers; and
adjusting the direct current offsets of the output voltage potentials by the amounts of offset adjustment indicated by the offset adjustment codes.

10. The method of claim 9, further comprising storing at least a subset of the offset adjustment codes corresponding to at least a subset of the buffers in a data storage device.

11. The method of claim 10, wherein storing the at least the subset of the offset adjustment codes corresponding to at least a subset of the buffers in the data storage device includes storing the at least the subset of the offset adjustment codes in fuses.

12. The method of claim 10, wherein storing the at least the subset of the offset adjustment codes comprises storing a number of the offset adjustment codes that is equal to a number of the buffers.

13. The method of claim 10, wherein storing the at least the subset of the offset adjustment codes comprises storing a number of the offset adjustment codes that is less than a number of the buffers.

14. The method of claim 13, wherein providing the offset adjustment codes to the offset adjustment inputs of the buffers includes:
providing, to the subset of the buffers, the subset of the offset adjustment codes to the subset of the buffers; and
providing, to others of the buffers outside of the subset of the buffers, zero offset adjustment codes indicating zero offset adjustment.

15. The method of claim 10, further comprising storing identification codes identifying those of the buffers the stored at least a subset of the offset adjustment codes should be provided to.

16. The method of claim 10, further comprising storing skip codes indicating numbers of the buffers to skip in an ordered sequence of the buffers to identify the buffers the offset adjustment codes should be provided to.

17. An apparatus, comprising:
input terminals;
buffers operably coupled to the input terminals, the buffers configured to provide output voltage potentials responsive to input signals received at the input terminals, the buffers configured to adjust direct current offsets of the output voltage potentials responsive to offset adjustment codes provided to the buffers; and
control circuitry operably coupled to the buffers, the control circuitry configured to provide the offset adjustment codes to the buffers.

18. The apparatus of claim 17, wherein the buffers are input buffers of a memory device for buffering the input signals including write data to be written to the memory device.

19. The apparatus of claim 17, further comprising a data storage device configured to store a number of the offset adjustment codes that is less than a number of the buffers for a subset of the buffers, wherein the control circuitry is configured to provide a zero offset adjustment code indicating zero offset adjustment to others of the buffers outside of the subset of the buffers.

20. The apparatus of claim 19, wherein the data storage device comprises fuses for storing the offset adjustment codes.

* * * * *